United States Patent
Lei et al.

(10) Patent No.: US 9,882,078 B2
(45) Date of Patent: Jan. 30, 2018

(54) INTEGRATED BACK-SHEET ASSEMBLY FOR PHOTOVOLTAIC MODULE

(71) Applicant: E I DU PONT DE NEMOURS AND COMPANY, Wilmington, DE (US)

(72) Inventors: Changming Lei, Shanghai (CN); Zelin Liu, Shanghai (CN); Minfang Mu, Shanghai (CN)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 587 days.

(21) Appl. No.: 14/151,120

(22) Filed: Jan. 9, 2014

(65) Prior Publication Data

US 2014/0190545 A1   Jul. 10, 2014

(30) Foreign Application Priority Data

Jan. 10, 2013   (CN) .......................... 2013 1 0008721

(51) Int. Cl.
   *H01L 31/049* (2014.01)
   *H01L 31/05* (2014.01)

(52) U.S. Cl.
   CPC ........ *H01L 31/0516* (2013.01); *H01L 31/049* (2014.12); *Y02E 10/50* (2013.01); *Y10T 156/1057* (2015.01)

(58) Field of Classification Search
   CPC ................. H01L 31/048; H01L 31/049; Y10T 156/1057; Y02E 10/50
   USPC .... 136/244, 256; 156/242, 244.11, 248, 253
   See application file for complete search history.

(56) References Cited

U.S. PATENT DOCUMENTS

| | | | |
|---|---|---|---|
| 2009/0207546 A1* | 8/2009 | Cho | B64G 1/52 361/212 |
| 2010/0210745 A1* | 8/2010 | McDaniel | C09D 5/008 521/55 |
| 2011/0030759 A1* | 2/2011 | Funakoshi | H01L 31/02244 136/244 |
| 2012/0285501 A1* | 11/2012 | Zhao | H01L 31/0516 136/244 |

(Continued)

FOREIGN PATENT DOCUMENTS

WO   2011/044417 A2   4/2011

OTHER PUBLICATIONS

Kim et al., "Bonding Quality of Copper-Nickel Fine Clad Metal Prepared by Surface Activated Bonding", Materials Transactions, vol. 51, No. 4 (2010) pp. 787 to 792.*

(Continued)

*Primary Examiner* — Tae-Sik Kang

(57) ABSTRACT

A process for forming a back-sheet assembly for a photovoltaic module having multiple solar cells with back-side electrical contacts includes providing a substrate, adhering an electrically conductive metal circuit to the substrate, adhering release pads to the metal circuit in a pattern, adhering an insulating layer to the metal circuit, forming openings in said insulating layer in a pattern over the release pads, and filling the openings with electrically conductive material that is in electrical contact with the electrically conductive metal circuit. A process for forming a photovoltaic module with this back-sheet assembly is also provided. The back-sheet assembly and photovoltaic module made with the back-sheet assembly are also provided.

13 Claims, 6 Drawing Sheets

(56) References Cited

U.S. PATENT DOCUMENTS

2013/0000715 A1* 1/2013 Moslehi ............ H01L 31/02244
 136/256
2014/0000682 A1* 1/2014 Zhao ................... H01L 31/0481
 136/251

OTHER PUBLICATIONS

ASTM D1876-08, Standard Test Method for Peel Resistance of Adhesives (T-Peel Test).

* cited by examiner

INTEGRATED BACK-SHEET ASSEMBLY FOR PHOTOVOLTAIC MODULE

FIELD OF THE INVENTION

The present invention relates integrated back-sheet and back-sheet assemblies for making photovoltaic modules, to processes for making integrated back-sheet and encapsulant assemblies, and to processes for making back-contact photovoltaic modules with such integrated back-sheet and encapsulant assemblies.

BACKGROUND

A photovoltaic cell converts radiant energy, such as sunlight, into electrical energy. In practice, multiple photovoltaic cells are electrically connected together in series or in parallel and are protected within a photovoltaic module or solar module.

A photovoltaic module typically comprises, in order, a light-transmitting substrate or front sheet, an encapsulant layer, an active photovoltaic cell layer, another encapsulant layer and a back-sheet. The light-transmitting substrate is typically glass or a durable light-transmitting polymer film. The encapsulant layers adhere the photovoltaic cell layer to the front and back sheets, they seal and protect the photovoltaic cells from moisture and air, and they protect the photovoltaic cells against physical damage and chemical attack. The encapsulant layers are typically comprised of a thermoplastic or thermosetting resin such as ethylene-vinyl acetate copolymer (EVA). The photovoltaic cell layer is any type of photovoltaic cell that converts sunlight to electric current such as single crystal silicon solar cells, polycrystalline silicon solar cells, microcrystal silicon solar cells, amorphous silicon-based solar cells, copper indium (gallium) diselenide solar cells, cadmium telluride solar cells, compound semiconductor solar cells, dye sensitized solar cells, and the like. The back-sheet provides structural support for the module, it electrically insulates the module, and it helps to protect the solar cells, module wiring and other components against the elements, including heat, water vapor, oxygen and UV radiation. The module layers need to remain intact and adhered to each other for the service life of the photovoltaic module, which may extend for multiple decades.

Photovoltaic cells have had electrical contacts on both the front and back sides of the photovoltaic cells. However, contacts on the front sunlight receiving side of the photovoltaic cells can cause up to a 10% shading loss. In back contact photovoltaic cells, all of the electrical contacts are moved to the back side of the photovoltaic cell. With both the positive and negative polarity electrical contacts on the back side of the photovoltaic cells, electrical circuitry is needed to provide electrical connections to the positive and negative polarity electrical contacts on the back of the photovoltaic cells.

In a back contact photovoltaic module, an integrated back-sheet having patterned electrical circuitry is electrically connected to back contacts on the photovoltaic cells during lamination of the solar module. A back-sheet 10 is shown in FIG. 1a with a metal foil adhered to a surface of the back-sheet substrate 14. The metal foil, such as a copper or aluminum foil, is patterned by etching, die cutting or other processes to form one or more electrically conductive circuits 12a, 12b, 12c and 12d. As shown in FIG. 1b, an interlayer dielectric (ILD) layer 16 is formed over the foil circuits, typically by laminating or screen printing a polymeric material over the electrically conductive circuit. Openings 18 are formed in the ILD where back electrical contacts on the photovoltaic cells are to contact the foil circuits. A thermoplastic or thermosetting encapsulant sheet 20 shown in FIG. 1c, typically an EVA sheet, is placed over the ILD layer with openings formed or punched out at locations corresponding to the openings in the ILD. An electrically conductive adhesive is applied in the openings of the ILD and encapsulant layers. Back contact photovoltaic cells 22a, 22b and 22c are placed on the encapsulant layer using pick and place technology, as shown in outline form in FIG. 1d with the position of the positive and negative polarity contacts on the back side of the solar cells shown. The back contacts on the photovoltaic cells align with electrically conductive adhesive inserted in the openings in the ILD and encapsulant sheet. The back contacts on the photovoltaic cell are adhered to and electrically connected to the metal circuits on the back-sheet by the electrically conductive adhesive by heating the electrically conductive adhesive, as for example in a thermal press. The positive polarity contacts of one solar cell are electrically connected in series to the negative contacts of an adjacent solar cell by the metal circuits, as shown in FIG. 1d.

Aligning the openings of the ILD and/or encapsulant layers with electrically conductive circuits, inserting the electrically conductive adhesive into the aligned openings, and then aligning the back contacts of the back-contact solar cells with the openings in the encapsulant and ILD layers has been difficult to accomplish due to stretch, expansion, contraction and other flexibility in the encapsulant and/or ILD layers. There is a need for integrated back-sheet and encapsulant assemblies for back-contact photovoltaic modules in which the openings in the encapsulant and/or ILD layers are more easily and dependably aligned with the electrically conductive circuit of the integrated back-sheet and with the electrical contacts on the back of the back-contact solar cells.

SUMMARY

A process for forming a back-sheet assembly for a photovoltaic module having multiple solar cells with back-side electrical contacts is provided. The process includes providing a substrate having a back surface and a front surface; adhering an electrically conductive metal circuit to the front surface of said substrate; adhering a plurality of release pads to a front surface of the electrically conductive metal circuit in a pattern; adhering an insulating layer to the electrically conductive metal circuit over said electrically conductive metal circuit and the release pads; forming a plurality of openings in the insulating layer in a pattern corresponding to the pattern in which the release pads are adhered to the electrically conductive metal circuit; and filling the plurality of openings in the insulating layer with an electrically conductive material that is in electrical contact with the electrically conductive metal circuit. In one embodiment, the openings in the insulating layer are formed by drilling openings in the insulating layer over the release pads, as for example by mechanical drilling or laser drilling. In another embodiment, the openings in the insulating layer are formed by cutting the insulating layer to form a plurality of cut sections in the insulating layer, the cut sections being disposed over corresponding release pads and being defined by a cut in the insulating layer, and then removing the cut sections in the insulating layer from the insulating layer. The cutting of the insulating layer to form a plurality of cut sections may be done by die cutting, laser cutting or calendering.

In a preferred embodiment, the release pads are comprised of polymer. The release pads may be screen printed on the electrically conductive metal circuit. Alternatively, the release pads may be formed by casting, extruding or laminating a polymer layer on the electrically conductive metal circuit, cutting the polymer layer to form the release pads in the polymer layer and removing polymer layer portions between and around said release pads.

In a preferred embodiment, the insulating layer comprises a polymer insulating layer. The polymer insulating layer may be extruded, laminated or cast on said electrically conductive metal circuit. The insulating layer may comprise two or more layers, as for example, an ILD adhered to said electrically conductive metal circuit and an encapsulant layer adhered to the ILD.

In a disclosed process, the release pads may be comprised of an electrically conductive material, and the peel strength between said release pads and said electrically conductive metal circuit is greater than the peel strength between said release pads and the insulating layer, such that the removing of the cut sections of the insulating layer over the release pads leaves the release pads adhered to the electrically conductive metal circuit. In an alternative embodiment, the release pads are comprised of a polymeric release film, and the peel strength between the release pads and the electrically conductive metal circuit is less than the peel strength between the release pads and the insulating layer such that the removing the cut sections of the insulating layer over the release pads also removes the release pads from the electrically conductive metal circuit.

In a disclosed embodiment, in the step of filling the plurality of openings in insulating layer with electrically conductive material, the electrically conductive material is a plurality of electrically conductive solid objects that are inserted into openings in said insulating layer. In another embodiment, the electrically conductive material is an electrically conductive adhesive in the form of a liquid, a melt or powder. In one preferred embodiment, the electrically conductive adhesive is a polymer filled with conductive metal particles.

A process for forming a back-contact photovoltaic module is also provided in which a back-sheet assembly as discussed above is provided. A plurality of back-contact solar cells having a light receiving side and an opposite back side are provided where the back-contact solar cells each having a plurality of electrical contacts on their back side in a pattern corresponding to the pattern of openings in the insulating layer that are filled with electrically conductive material. The back side of the plurality of solar cells is adhered to the insulating layer such that the electrical contacts on the back side of the solar cells are in electrical contact with the electrically conductive metal circuit through the electrically conductive material in the openings in said insulating layer.

A back-sheet assembly for photovoltaic module having multiple solar cells each having back-side electrical contacts is also provided. The assembly includes: a substrate having a back surface and a front surface; an electrically conductive metal circuit adhered to the front surface of the substrate; a plurality of electrically conductive release pads adhered to the electrically conductive metal circuit in a pattern; an insulating layer over the electrically conductive metal circuit; and a plurality of openings in the insulating layer over the release pads, the opening being filled with an electrically conductive material and being in a pattern corresponding to the pattern of the release pads adhered to the conductive circuit.

A back-contact photovoltaic module incorporating the back-sheet assembly is also provided. The module has a plurality of back-contact solar cells having a light receiving side and an opposite back side. The back contact solar cells each having a plurality of electrical contacts on their back side in a pattern corresponding to the pattern of openings in the insulating layer that are filled with electrically conductive material. The back sides of the plurality of solar cells are adhered to the insulating layer such that the electrical contacts on the back sides of the solar cells are in electrical contact with the electrically conductive metal circuit through the electrically conductive material in the openings in the insulating layer.

BRIEF DESCRIPTION OF THE DRAWINGS

The detailed description will refer to the following drawings which are not drawn to scale and wherein like numerals refer to like elements.

DETAILED DESCRIPTION OF THE INVENTION

Figure 1A:
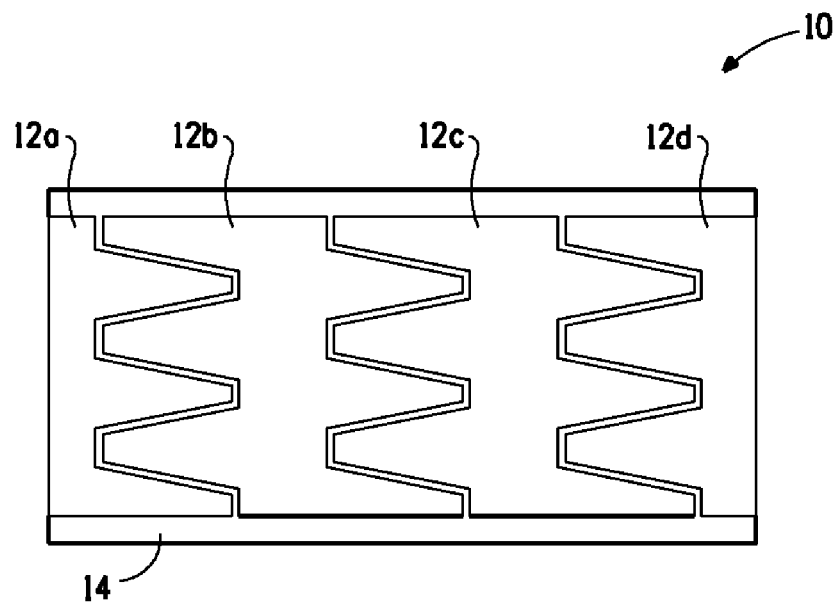
FIGS. 1a-1c are plan views of a conventional integrated back sheet assembly for a back-contact photovoltaic module.
Figure 1B:
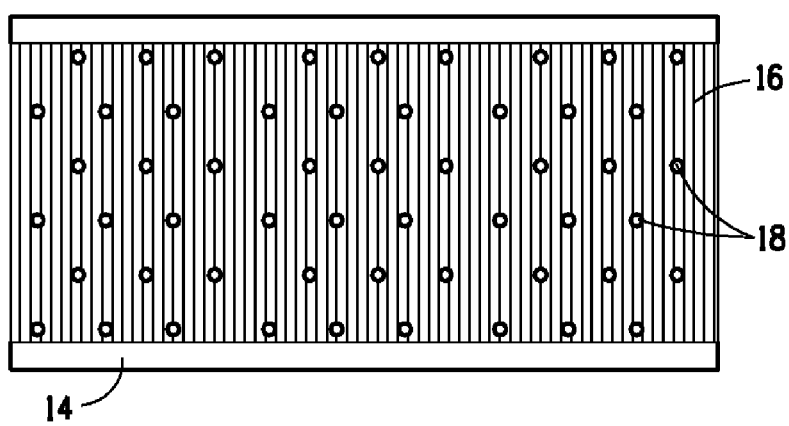
Figure 1C:
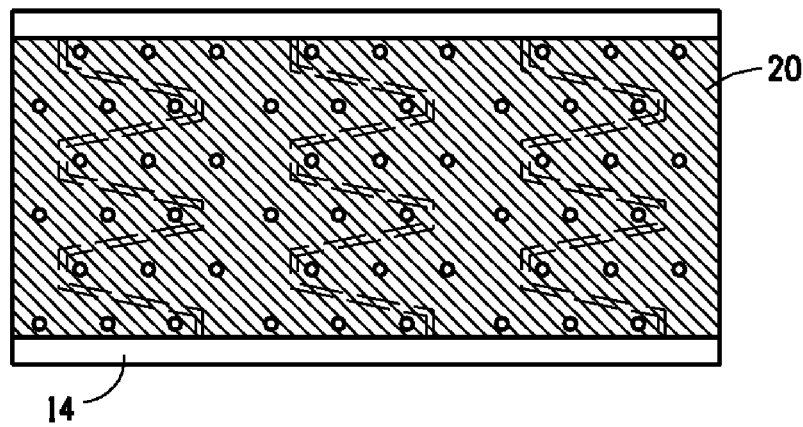
Figure 1D:
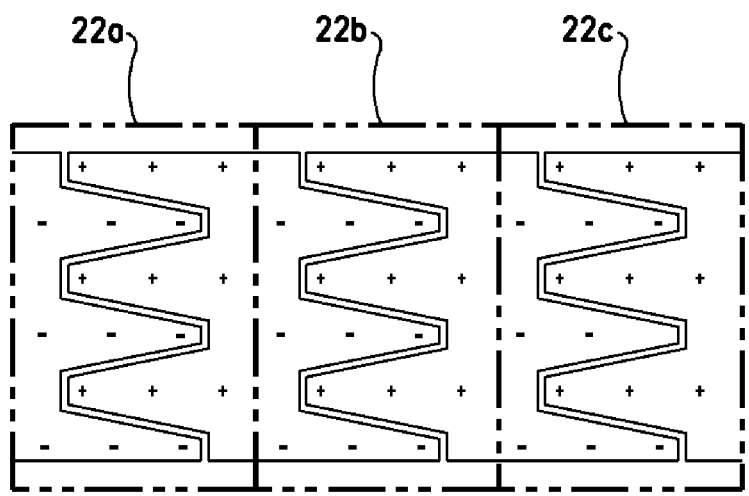
FIG. 1d shows the position of back-contact solar cells placed over the back sheet assembly of FIG. 1c with the locations of the backside electrical contacts shown.

To the extent permitted by the applicable patent law, all publications, patent applications, patents, and other references mentioned herein are incorporated by reference in their entirety.

The materials, methods, and examples herein are illustrative only and the scope of the present invention should be judged only by the claims.

Definitions

The following definitions are used herein to further define and describe the disclosure.

As used herein, the terms "comprises," "comprising," "includes," "including," "has," "having" or any other variation thereof, are intended to cover a non-exclusive inclusion.

For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to.

As used herein, the terms "sheet", "layer" and "film" are used in their broad sense interchangeably. A "front sheet" is a sheet, layer or film on the side of a photovoltaic module that faces a light source and may also be described as an incident layer. Because of its location, it is generally desirable that the front sheet has high transparency to the desired incident light. A "back-sheet" is a sheet, layer or film on the side of a photovoltaic module that faces away from a light source, and is generally opaque. In some instances, it may be desirable to receive light from both sides of a device (e.g., a bifacial device), in which case a module may have transparent layers on both sides of the device.

"Encapsulant" layers are used to encase the fragile voltage-generating photoactive layer, to protect it from environmental or physical damage, and hold it in place in the photovoltaic module. Encapsulant layers may be positioned between the solar cell layer and the front incident layer, between the solar cell layer and the back-sheet, or both. Suitable polymer materials for the encapsulant layers typically possess a combination of characteristics such as high transparency, high impact resistance, high penetration resistance, high moisture resistance, good ultraviolet (UV) light resistance, good long term thermal stability, good long term weatherability, and adequate adhesion strength to front sheets, back-sheets, other rigid polymeric sheets and solar cell surfaces.

"Inter layer dielectric (ILD)" is a layer of a low dielectric constant k material used to electrically separate closely spaced electrically conductive layers or lines arranged in several levels of an electrical circuit or device such as a photovoltaic module.

As used herein, the terms "photoactive" and "photovoltaic" may be used interchangeably and refer to the property of converting radiant energy (e.g., light) into electric energy.

As used herein, the terms "photovoltaic cell" or "photoactive cell" or "solar cell" mean an electronic device that converts radiant energy (e.g., light) into an electrical signal. A photovoltaic cell includes a photoactive material layer that may be an organic or inorganic semiconductor material that is capable of absorbing radiant energy and converting it into electrical energy. The terms "photovoltaic cell" or "photoactive cell" or "solar cell" are used herein to include photovoltaic cells with any types of photoactive layers including, crystalline silicon, polycrystalline silicon, microcrystal silicon, and amorphous silicon-based solar cells, copper indium (gallium) diselenide solar cells, cadmium telluride solar cells, compound semiconductor solar cells, dye sensitized solar cells, and the like.

As used herein, the term "back-contact solar cell" means a solar cell having both positive and negative polarity contacts located on its back side, including metal wrap through (MWT), metal wrap around (MWA), emitter wrap through (EWT), emitter wrap around (EWA), and interdigitated back contact (IBC) solar cells.

As used herein, the term "photovoltaic module" or "solar module" or "solar cell module" (also "module" for short) means an electronic device having at least one photovoltaic cell protected on one side by a light transmitting front sheet and protected on the opposite side by an electrically insulating protective back-sheet.

As used herein, terms "die-cut" and "die-cutting" refer to a manufacturing process wherein one or more blades of a desired shape slice through one or more layers of a material such as wood, plastic, paper, metal or fabric to produce cut shapes of material, and includes die-cutting done on flat, rotary or multiple-step presses, as well as die-cutting by laser.

Disclosed herein is an integrated back-sheet and assembly for a back-contact solar cell module, processes for forming such an assembly, back-contact solar cell modules made with such an integrated back-sheet and assembly, and processes for forming such back-contact solar cell modules.

The disclosed integrated back-sheet includes a substrate. The substrate has a back surface and a front surface, wherein the front surface faces towards the light source when in use. The substrate may be comprised of inorganic materials, organic materials, or combinations of inorganic and organic materials. Suitable inorganic materials that may be used in forming the substrate include, without limitation, metallic materials (such as aluminum foil, aluminum panel, copper, steel, alloy, stainless steel, etc.), non-metallic inorganic materials (such as amorphous materials (e.g., glass) and crystalline materials (e.g., quartz)), inorganic compounds, ceramics, and minerals (such as mica or asbestos). Preferably, the substrate is comprised of polymeric materials, optionally in conjunction with other materials, used in photovoltaic back-sheets. The substrate may comprise a polymer film, sheet or laminate that is used as a back-sheet in conventional photovoltaic modules. The substrate may, for example, be comprised of film comprised of one or more of polyester, fluoropolymer, polycarbonate, polypropylene, polyethylene, cyclic polyolefin, acrylic, cellulose acetate, acrylate polymer such as polymethylmethacrylate (PMMA), polystyrene, styrene-acrylate copolymers, acrylonitrile-styrene copolymers, poly(ethylene naphthalate), polyethersulfone, polysulfone, polyamide, epoxy resin, glass fiber reinforced polymer, carbon fiber reinforced polymer, vinyl chloride polymers, polyvinylidene chloride, vinylidene chloride copolymers, and the like. The substrate of the integrated back-sheet may also comprise layers of such polymer films. The layers may be adhered to each other by adhesives between the layers or by adhesives incorporated into one or more of the layers to form laminated or coated layers.

Laminates of polyester films and fluoropolymer films are especially suitable for the substrate. Suitable polyesters include polyethylene terephthalate (PET), polytrimethylene terephthalate, polybutylene terephthalate, polyhexamethylene terephthalate, polyethylene phthalate, polytrimethylene phthalate, polybutylene phthalate, polyhexamethylene phthalate or a copolymer or blend of two or more of the above. Suitable fluoropolymers include polyvinylfluoride (PVF), polyvinylidene fluoride, polytetrafluoroethylene, ethylene-tetrafluoroethylene copolymers and combinations thereof. In one embodiment, the substrate comprises a biaxially oriented PET film adhered to a PVF film. In another embodiment, the substrate comprises polyester film with fluoropolymer films adhered to the opposite sides of the polyester film. Alternatively, the substrate may comprise a single layer polymer sheet such as a synthetic rubber or polyolefin-based sheet.

There are no specific restrictions on the thickness of the substrate or on the thickness of the various layers of the substrate. Thickness varies according to specific application. In one preferred embodiment, the substrate comprises a fluoropolymer layer with a thickness in the range of 10-50 µm adhered to a PET film with a thickness of 50-500 µm.

Various known additives and fillers may be added to the polymer layer(s) of the substrate to satisfy various different requirements. Suitable additives may include, for example, light stabilizers, UV stabilizers and absorbers, thermal stabilizers, anti-hydrolytic agents, light reflection agents, flame retardants, pigments, titanium dioxide, dyes, slip agents, calcium carbonate, silica, and reinforcement additives such as glass fibers and the like. There are no specific restrictions to the content of the additives and fillers in the substrate layers as long as the additives do not produce an undue adverse impact on the substrate layers or their adhesion to other layers of the integrated back-sheet or to the adhesion of the substrate to the electrically conductive metal circuit.

The polymeric films or sheets of the substrate may include one or more non-polymeric layers or coatings such as a metallic, metal oxide or non-metal oxide surface coating. Such coatings are helpful for reducing moisture vapor transmission through a back-sheet structure. The thickness of such a metallic, metal oxide layer or non-metal oxide layer on one or more of the polymer films typically measures between 50 Å and 4000 Å, and more typically between 100 Å and 1000 Å, but may be up to 50 um thick.

Figure 2:
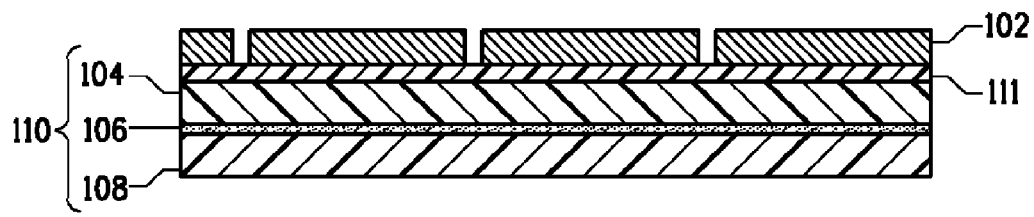
FIG. 2 is a cross-sectional view of a substrate with an electrically conductive metal circuit adhered thereon.

In the embodiment shown in FIG. 2, a substrate 110 is comprised of multiple layers. The layers preferably comprise polymer film layers and one or more adhesive layers. In the embodiment shown in FIG. 2, the substrate 110 comprises an outer polymer layer 108, an adhesive layer 106, and another polymer layer 104. Typically, the outer polymer layer 108 comprises a durable polymer film such as a fluoropolymer film as described above. The adhesive layer 106 may comprise, without limitation, reactive adhesives (e.g., polyurethane, acrylic, epoxy, polyimide, or silicone adhesives) and non-reactive adhesives (e.g., polyethylenes (including ethylene copolymers) or polyesters). The polymer layer 104 is preferably another polymer film with good moisture barrier and electrical insulation properties such as a polyester film as described above.

The disclosed integrated back-sheet further includes an electrically conductive metal circuit adhered to the substrate. The electrically conductive metal circuit may be any type of circuit such as a printed metal circuit or a circuit formed from a metal foil adhered to the substrate and etched, die-cut or otherwise formed into one or more patterned electrically conductive circuits. Where the electrically conductive circuit is formed from a metal foil, the foil is preferably an electrically conductive metal foil such as foil of aluminum, tin, copper, nickel, silver, gold, tin coated copper, silver coated copper, gold coated copper, steel, invar, and alloys thereof. Aluminum foil and copper foil are most commonly selected on the basis of cost and other factors. The thickness of the foil may be in the range of about 5-200 µm, or preferably 10-150 µm. Examples of suitable foils include a 35 µm thick copper foil (type: THE-T9FB) from Suzhou Fukuda Metal Co., Ltd of Suzhou, China, and a 35 µm thick MHT copper foil from OAK-MITSUI LLC, of Hoosick Falls, N.Y., USA. The metal foil may be adhered to the substrate by an adhesive tie layer such as an extruded thermoplastic adhesive. Preferred thermoplastic adhesives include ethylene copolymers, acrylic polymers and copolymers, polymethyl methacrylate, polyesters, and blends of such polymers. The thickness of the tie layer is preferably in the range of about 3-700 µm, and is more preferably in the range to 5-500 µm. As shown in FIG. 2, the electrically conductive metal circuits 102 are attached to the substrate 110 by an adhesive tie layer 111.

Figure 3:
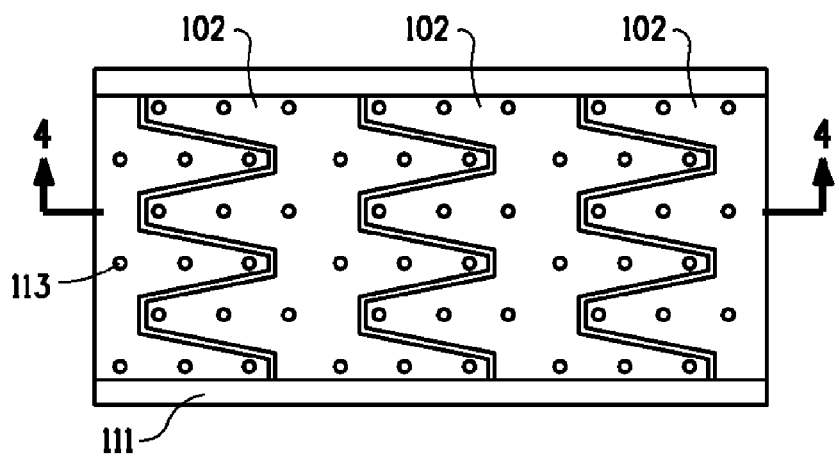
FIG. 3 is a plan view of an assembly that includes a substrate, an electrically conductive metal circuit, and release pads formed on the surface of the metal circuit.
Figure 4:
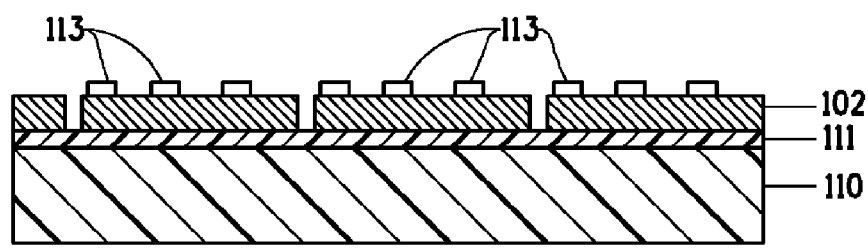
FIG. 4 is a cross-sectional view of the assembly of FIG. 3 taken along the line 4-4.

Releasing separation pads are applied to the exposed surface of the electrically conductive metal circuit 102. FIG. 3 is a plan view of electrically conductive metal circuits 102 with release pads 113 applied on the electrically conductive metal circuits. The release pads are preferably comprised of a polymer. In certain embodiments, the release pads are comprised of an electrically conductive material such as an electrically conductive adhesive. In other embodiments, the release pads are comprised of a polymer release film, such as a polyester film that can be pulled from the electrically conductive metal circuit. The release pads may be adhered to the electrically conductive metal circuit by adhesive properties of the release pad material or by an adhesive, such as a pressure sensitive adhesive, applied between the release pads and the electrically conductive metal circuit. In one embodiment, the release pads are printed onto the electrically conductive metal circuit, as for example by ink jet printing or screen printing. In another embodiment, a polymer release film is applied to the electrically conductive circuit, the release pads are cut from the applied film, as for example by die cutting, laser cutting or other mechanical cutting, and the remaining film between the cut release pads is peeled from the electrically conductive metal circuit to leave the release pads 113 as shown in FIG. 3. FIG. 4 shows a cross-sectional view of the assembly of FIG. 3 taken along the line 4-4 of FIG. 3.

The release pads must be thick enough to remain intact when peeled from the electrically conductive metal circuit, or when another polymer is pulled away from the surface of the release pads. The thickness of the release pads is preferably in the range of about 3-1000 µm, and is more preferably in the range to 5-500 µm.

Any polymer material useful for making releasable polymer films can be used to make the release pads. Preferred polymers include polyesters such as polyethylene terephthalate and poly(methyl methacrylate), polyolefins such as polyethylene, biaxially oriented polypropylene, and ethylene copolymers, elastomers such as fluoropolymer elastomers and polyolefin elastomers, and fluoropolymers such as poly(tereafluorotheylene). The release pads may also be made from polymer releasable films. Preferred films include polyethylene terephthalate film, polyethylene film, biaxially oriented polypropylene films and the like. The surface of the releasable polymer films may be treated by corona, and treatment such as corona treated PET. The surface of the releasable polymer films may be further coated by release additives such as silicone or by adhesive such as acrylic. Releasable polymer films are commercially available, for example, siliconized polyester films from Mitsubishi Plastics, Inc. under the trade name of Hostaphan®. The release pads may further contain any additive or filler known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, anti-hydrolytic agents, light reflection agents, pigments, titanium dioxide, dyes, slip agents, calcium carbonate, dispersants, surfactants, chelating agents, coupling agents, adhesives, primers, reinforcement additives, such as glass fiber, fillers and the like.

In an embodiment where the release pads are not removed from the electrically conductive metal circuits, but where other materials are pulled from the release pads, it may be desirable for the release pads to be electrically conductive. The electrical conductive materials may be a conductive adhesive such as composites comprising a polymer adhesive matrix and conductive fillers. For example, electrically conductive release pads may be comprised of ethylene vinyl acetate copolymer loaded with a silver powder, fibers or flakes. The electrically conductive release pads may be an adhesive that is thermally cured for dimensional stability during normal vacuum thermal lamination of PV module, and may be a conductive adhesive such as Loctite 3888 or Loctite 5421 from Henkel Corporation, of Germany. An electrically conductive material that can be screen printed to form electrically conductive release pads is a polyvinylidene fluoride/hexafluoropropene copolymer loaded with a silver powder and in a solvent such as methyl isobutyl ketone. The electrically conductive materials may also be conductive polymers such as polyacetylene, or polyphenylene vinylene.

Figure 5A:
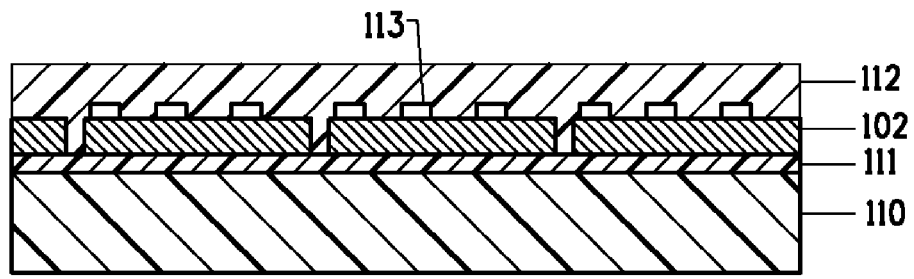
FIG. 5a is a cross-sectional view of the assembly of FIG. 4 showing the application of an insulating layer over the assembly.

The disclosed integrated back-sheet also comprises one or more insulating layers adhered over the electrically conductive metal circuit(s) and the release pads. The insulating layer(s) may comprise suitable inorganic materials, organic materials, or combinations of inorganic and organic materials. Suitable inorganic materials that may comprise the insulating layer(s) include, without limitation, non-metallic inorganic materials (such as amorphous materials (e.g., glass) or crystalline materials (e.g., quartz)), inorganic compounds, ceramics, and minerals (such as mica or asbestos). Preferably, the insulating layer includes at least one layer of a polymer that will adhere to the electrically conductive metal circuit and to the back side of a back-contact solar cell. As shown in FIG. 5a, an insulating layer 112 is adhered over the electrically conductive metal circuits 102 and the release pads 113. The insulating layer may be a pre-formed polymer film that is laminated over the electrically conductive metal circuits, or it may alternatively be a film that is extruded or cast directly over the electrically conductive circuits.

The insulating layer 112 may, for example, be an extruded polymer layer that is extruded over the electrically conductive metal circuits 102 and compressed against the electrically conductive metal circuits 102 using a compression roller or press. Alternatively, the insulating layer may be applied as a film and thermally pressed against the electrically conductive metal circuits 102 and the underlying substrate 110 using a roller or press. The insulating layer 112 preferably has a thickness in the range of about 5 to 2000 μm and more preferably within the range of 10 to 500 μm. The layer 112 may be comprised of a polymer with adhesive properties that allow it to adhere directly to the electrically conductive metal circuits 102, or another adhesive, such as a polyurethane adhesive, may be applied between the insulating layer 112 and the electrically conductive metal circuits 102. The insulating layer preferably includes at least one layer of polymer that remains very viscous at typical photovoltaic module lamination temperatures of about 120 to 180° C., and more preferably 125 to 160° C. For example, a thermoplastic polymer with a melt flow rate of in the range of 0 to 100 g/10 min (test condition: 190° C./2.16 kg), and more preferably 0 to 50 g/10 min (test condition: 190° C./2.16 kg) serves well as a layer of the insulating layer because such a polymer remains sufficiently viscous during thermal lamination of the module so that the insulating layer serves to separate the contacts on the back of the solar cell from the electrically conductive metal circuits so as to prevent shorting.

The insulating layer may be formed of a polymer used as an encapsulant material in photovoltaic modules. The insulating layer may, for example, be a film or sheet comprising, without limitation, polyolefins, poly(vinyl butyral) (PVB), polyurethane (PU), polyvinylchloride (PVC), acid copolymers, silicone elastomers, epoxy resins, or a combination thereof. Suitable polyolefins include, without limitation, polyethylenes, ethylene vinyl acetates (EVA), ethylene acrylate copolymers (such as poly(ethylene-co-methyl acrylate) and poly(ethylene-co-butyl acrylate)), ionomers, polyolefin block elastomers, and the like. Exemplary PVB based materials include, without limitation, DuPont™ PV5200 series encapsulant sheets. Exemplary ionomer based materials include, without limitation, DuPont™ PV5300 series encapsulant sheets and DuPont™ PV5400 series encapsulant sheets from DuPont. Another exemplary polyolefin for the polymeric layer is metallocene-catalyzed linear low density polyethylene. The insulating layer may include cross-linking agent that promotes cross-linking upon heating so that the polymer layer remains very viscous throughout the thermal lamination of the module.

The insulating layer may be comprised of an extruded or cast thermoplastic polymer layer. Thermoplastic ethylene copolymers that can be utilized for the insulating layer include the ethylene copolymers disclosed in PCT Patent Publication No. WO2011/044417. Preferred ethylene copolymers are comprised of ethylene and one or more monomers selected from the group of consisting of $C_{1-4}$ alkyl acrylates, $C_{1-4}$ alkyl methacrylates, methacrylic acid, acrylic acid, glycidyl methacrylate, maleic anhydride, $C_4$-$C_8$ unsaturated anhydrides, monoesters of $C_4$-$C_8$ unsaturated acids having at least two carboxylic acid groups, diesters of $C_4$-$C_8$ unsaturated acids having at least two carboxylic acid groups and mixtures of such copolymers, wherein the ethylene content in the ethylene copolymer preferably accounts for 60-90% by weight. The ethylene copolymer used in the insulating layer may include a copolymer of ethylene and another α-olefin. The ethylene content in the copolymer may account for 60-90% by weight, preferably accounting for 65-88% by weight, and ideally accounting for 70-85% by weight of the ethylene copolymer. The other comonomer(s) preferably constitute 10-40% by weight, more preferably accounting for 12-35% by weight, and ideally accounting for 15-30% by weight of the ethylene copolymer. The ethylene copolymer layer is preferably comprised of at least 70 weight percent of the ethylene copolymer. The ethylene copolymer may be blended with up to 30% by weight, based on the weight of the polymeric layer, of other thermoplastic polymers such as polyolefins, as for example linear low density polyethylene, in order to obtain desired properties. Ethylene copolymers are commercially available. For example, one may be purchased from DuPont under the trade-name Bynel®.

The insulating layer may further contain any additive or filler known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, anti-hydrolytic agents, light reflection agents, pigments, titanium dioxide, dyes, slip agents, calcium carbonate, dispersants, surfactants, chelating agents, coupling agents, adhesives, primers, reinforcement additives, such as glass fiber, fillers and the like. There are no specific restrictions on the content of the additives and fillers in the insulating layer as long as the additives do not produce an undue adverse impact on the insulating layer or its adhesion to the electrically conductive circuit or back-sheet.

Figure 5B:
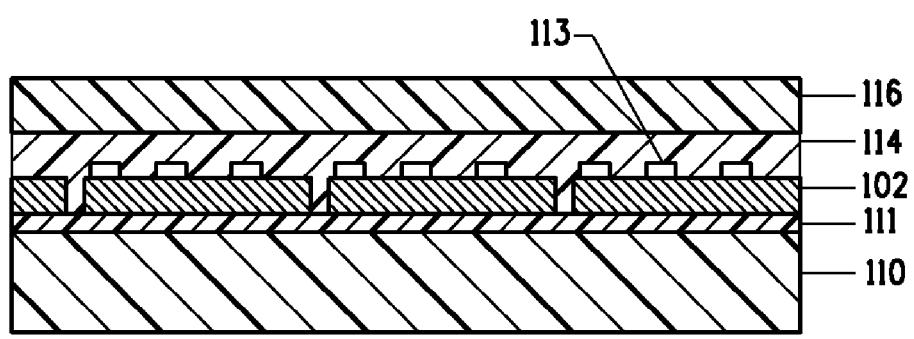
FIG. 5b is a cross-sectional view of the assembly of FIG. 4 showing the application of multiple layers over the assembly.

In the embodiment shown in FIG. 5b, the multiple layers 114 and 116 are applied over the electrically conductive metal circuits 102 and release pads 113. The layer 114 may, for example, be comprised of a polymer that adheres well to the electrically conductive metal circuits and the layer 116 may be comprised of a polymer that adheres well to both the layer 114 and to the back side of the solar cells. The layers 114 and 116 may be comprised of any of the materials described above with regard to the insulating layer 112 of the embodiment shown in FIG. 5a. Preferably, at least one of the layers 114 and 116 is made of a material that remains solid or very viscous at typical photovoltaic module lamination temperatures of about 120 to 180° C., and more preferably 125 to 160° C. A layer of such material will remain sufficiently viscous during module thermal lamination so as to maintain separation between the contacts on the back of the solar cell and the electrically conductive metal circuits of the integrated back-sheet so as to prevent shorting. In a preferred embodiment, layer 114 functions as an ILD where the layer 116 functions as a back encapsulant for the solar cells.

According to the disclosed process, vias or openings are formed in the insulating layer or layers to enable electrical connection between the electrical contacts on the back of the solar cells and the electrically conductive metal circuit of the integrated back-sheet. These vias or openings are filled with an electrically conductive material, such as an electrically conductive adhesive, that provides electrical connection through the openings and between the electrical contacts on the back of the solar cells and the electrically conductive metal circuit of the integrated back-sheet. These vias or openings can be formed in accordance with a number of different embodiments like those disclosed herein. The electrically conductive material can similarly be positioned in the vias or openings in accordance with a number of different embodiments like those disclosed herein.

Figure 6A:
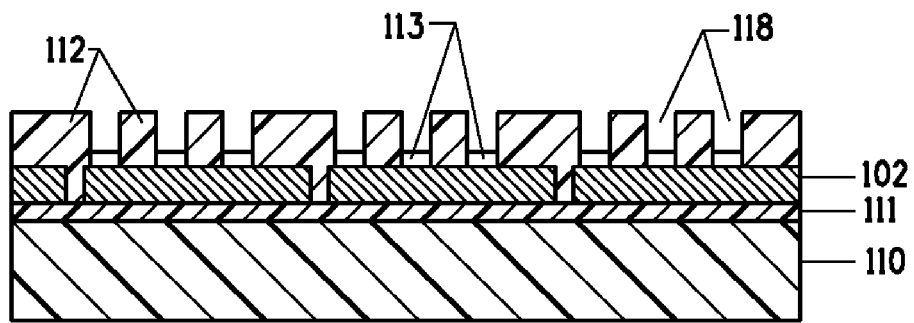
FIG. 6a is a cross-sectional view of the assembly of FIG. 5a showing an additional step.

In the embodiment shown in FIG. 6a, openings 118 are formed in the insulating layer or layers over the release pads 113. In the disclosed process, the insulating layer or layers is cut over the release pads in a shape generally corresponding to the shape of the release pads. The insulating layer or layers may be cut by known cutting methods such as die cutting, laser cutting, mechanical drilling, laser drilling, or calendaring. In a preferred embodiment, the insulating layer or layers is die cut over the release pads in a shape that generally corresponds to the shape of the release pads. Where the release pads were formed by die cutting, the same die cutting mold can be used to first cut the release pads and later cut the insulating layer. A die cutting mold formed of a flat plate with a plurality of open ended cutting blanks can be used to cut the openings 118. The cutting blanks may have a circular cross section, but other cross-sectional cutting shapes such as ovals or squares can be used to cut openings in the insulating layer. The cutting blanks are arranged in a pattern corresponding to the location of back contacts on the back side of a solar cell and to the aligned electrically conductive metal circuits to which the solar cell back contacts are to be connected. The mold is preferably made of metal, fiberglass, a rigid plastic, a composite or some combination thereof. A preferred material for the mold is steel. The openings in the insulating layer may alternatively be formed by a rotary die cutting process or other such cutting process.

In the process for forming the openings 118 in the layer 112 as shown in FIG. 6a, the material used in the release pads and the process used for forming the release pads on the electrically conductive metal circuit are selected such that the adhesion between the metal circuits and the release pads is greater than the adhesion between the insulating layer and the release pads. For example, when pressure sensitive adhesive (for example, acrylic-based adhesive) is used to adhere the release pads to the metal circuits, the bonding strength of the adhesive can be tuned by applying adhesive products with different adhesive chemical structures, different surface treatment of the metal circuits and different processing conditions. When the release pads are formed from a liquid conductive adhesive by screen printing, a silicone coupling agent can be used to achieve a higher bonding strength between the release pads and the metal circuits. When the insulating layer 112 is extruded, a lower bonding strength to the release pads can be obtained by using lower extrusion temperatures. The cutting mold may be pressed against the insulating layer down to the release pads 113 and then withdrawn along with the insulating layer material in the mold blanks so as to form the openings 118 in the insulating layer 112. As the adhesion between the release pads and the electrically conductive metal circuits is greater than the adhesion between the release pads and the insulating layer, the insulating layer is removed leaving behind the release pads. In the process illustrated in FIG. 6a, the release pads are formed of an electrically conductive material.

Figure 6B:
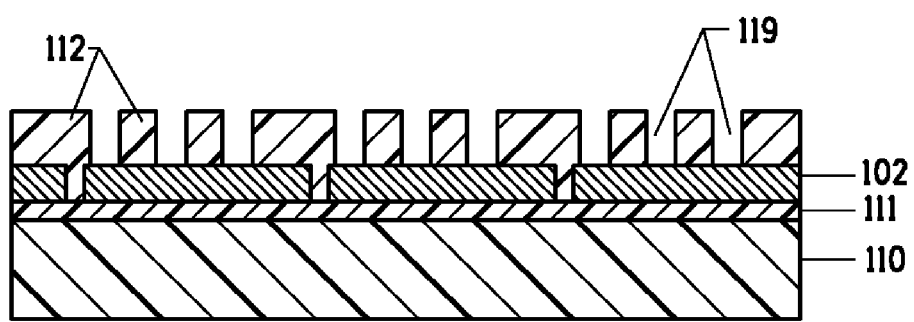
FIG. 6b is a cross-sectional view of the assembly of FIG. 5a showing an alternative additional step.

An alternative process for forming the vias or openings in the insulating layer is shown in FIG. 6b. In the process for forming the openings 119 in the layer 112 as shown in FIG. 6b, the material used in the release pads and the process used for forming the release pads on electrically conductive metal circuit are selected such that the adhesion between the metal circuits and the release pads is less than the adhesion between the insulating layer and the release pads. For example, when pressure sensitive adhesive-coated polyethylene releasable film (for example, acrylic-based adhesive coated on polyethylene film) is used to make the release pads, the bonding strength of the adhesive can be tuned by different processing conditions when applying a releasable polymer film on the metal circuits. For example, a lower pressure on the release film surface can be used to achieve a lower bonding strength between the releasable polymer film and the metal circuits. When the insulating layer 112 is extruded, a higher bonding strength to the release pads can be obtained by using higher extrusion temperatures. The cutting mold is pressed against the insulating layer down around the release pads 113 and then withdrawn along with the release pads and the insulating layer material in the mold blanks so as to form the openings 119 in the insulating layer 112 down to the metal circuits 102. As the adhesion between the release pads and the electrically conductive metal circuits is less than the adhesion between the release pads and the insulating layer, the release pads release from the metal circuits such that the release pads and insulating layer are removed leaving openings 119. In the process illustrated in FIG. 6b, the release pads do not have to be formed of an electrically conductive material, and can be an insulting material such as a non-conductive polymer.

Figure 7:
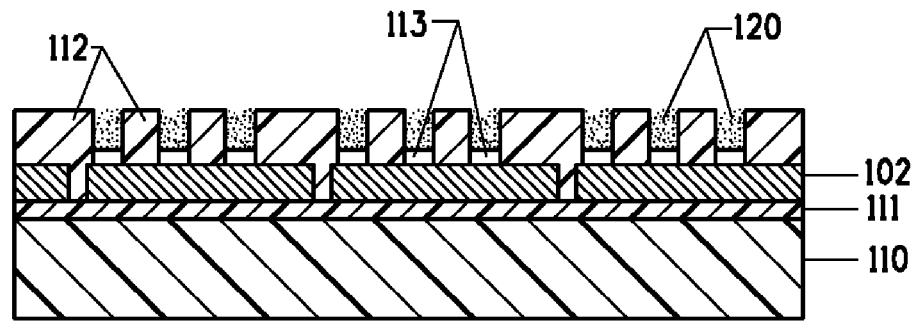
FIG. 7 is a cross-sectional view of the assembly of FIG. 6A showing an additional step.

In the disclosed processes, the openings or vias are filled with an electrically conductive material. This is the case whether the openings are the holes 118 of the embodiment shown in FIG. 6a, or the holes 119 of the embodiment shown in FIG. 6b. In FIG. 7, electrically conductive material 120 is introduced into the holes above the release pads 113, which are also made electrically conductive. The conductive material may be solid blanks of an electrically conductive material that are inserted into the openings, may be a conductive liquid or molten material, or may be a conductive powder that will solidify and adhere to the electrically conductive release pads or metal circuit and to the electrical contacts of a back-contact solar cell during module lamination. Electrically conductive solid material that can be formed into conductive blank discs may be conductive polymers such as polyacetylene and polyphenylene vinylene. An electrically conductive solid material that can be formed into conductive blanks or discs may be composites comprising of polymer base matrix and conductive fillers. The polymer base matrix can, for example, be ethylene copolymer, polyimide, acrylate, silicone elastomer, or fluoroelastomer. The conductive fillers can be metal particles such as Ag, Cu, Ni, W, metal coated particles such as Ag-coated polystyrene powder, Au-coated glass beads and non-metal particles such as carbon nanotubes or graphene. For example, suitable electrically conductive adhesives include ethylene vinyl acetate copolymer loaded with a conductive metal powder or flakes such as silver powder, or ethylene acrylic elastomer loaded with silver powders. An electrically conductive adhesive that may be used is an adhesive that is thermally cured for dimensional stability during normal vacuum thermal lamination of PV module, and may be a conductive adhesive such as Loctite 3888 or Loctite 5421 from Henkel Corporation, of Germany. An electrically conductive powder that can be used to form the electrically conductive material 120 is a conductive powder that can be sintered by heat treatment. Examples include Sn42/Bi58 low temperature alloy particles, nano-Ag particles, and low temperature alloy coated polystyrene particles.

Figure 8:
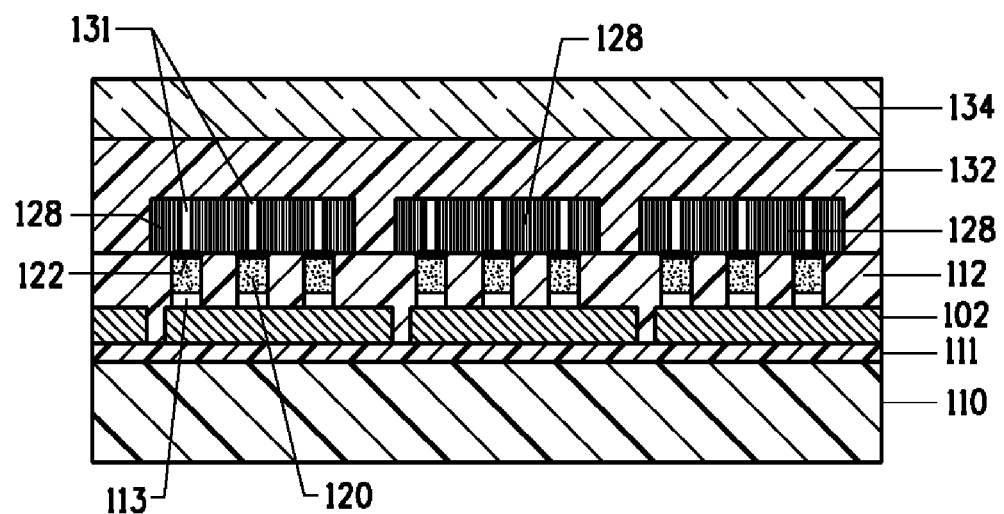
FIG. 8 is a cross-sectional view of a photovoltaic module incorporating the assembly of FIG. 7.

The disclosed assembly for a back-contact photovoltaic module comprises one or more back-contact solar cells aligned over the insulating layer of the disclosed integrated back-sheet assembly. Back-contact solar cells 128, as can be seen in FIG. 8, have both positive and negative polarity back side electrical contacts. The back contacts 122 that can be seen in the cross-sectional view of FIG. 8 connect to the front side of the solar cell through electrically conductive paste in vias 131 in the solar cell. Other back contacts not visible in FIG. 8 electrically connect to the back side of the solar cell. The back contacts on the back side of the solar cell align with the openings that have been formed in the insulating layer or layers when the solar cells are placed over the insulating layer 112.

In the disclosed assembly, a front encapsulant layer 132 is arranged over the front side of the solar cells 128 and a transparent front sheet 134, such as a glass or polymer front sheet, is placed over the front encapsulant layer. A typical glass type front sheet is 3.2 mm thick annealed low iron glass. The front encapsulant layer 132 may be comprised of any of the polymers described above with regard to the insulating layer. The front encapsulant layer may, for example, be a film or sheet comprising polyolefins, poly (vinyl butyral) (PVB), polyurethane (PU), polyvinylchloride (PVC), acid copolymers, silicone elastomers, epoxy resins, or a combination thereof, including polyethylenes, ethylene vinyl acetates (EVA), ethylene acrylate copolymers, ionomers, polyolefin block elastomers, and the like. The front encapsulant layer 132 may include cross-linking agent that promotes cross-linking upon heating so that the polymer layer remains viscous throughout the thermal lamination of the module.

After lay-up of the photovoltaic module components is complete, as shown in FIG. 8, the assembly is laminated in a press with the application of heat and pressure to form the disclosed back-contact photovoltaic module. The back-contact photovoltaic module may be produced through autoclave or non-autoclave processes. For example, the assembly constructs described above may be laid up in a vacuum lamination press and laminated together under vacuum with heat and standard atmospheric or elevated pressure. The assembly is laminated under heat and pressure and a vacuum (for example, in the range of about 27-28 inches (689-711 mm) Hg) to remove air. In an exemplary procedure, the laminate assembly of the present invention is placed into a bag capable of sustaining a vacuum ("a vacuum bag"), the air is drawn out of the bag using a vacuum line or other means of pulling a vacuum on the bag, the bag is sealed while maintaining the vacuum, the sealed bag is placed in an autoclave at a temperature of about 120° C. to about 180° C., at a pressure of about 200 psi (about 15 bars), for from about 10 to about 50 minutes. Preferably the bag is autoclaved at a temperature of from about 120° C. to about 160° C. for 10 minutes to about 45 minutes. More preferably the bag is autoclaved at a temperature of from about 135° C. to about 160° C. for about 10 minutes to about 40 minutes.

Air trapped within the laminate assembly may be removed through a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly may be passed through a set of nip rolls so that the air in the void spaces between the photovoltaic module outside layers, the photovoltaic cell layer and the encapsulant layers may be squeezed out, and the edge of the assembly sealed. This process may provide the final photovoltaic module laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and the pressure is raised to between about 100 psig and about 300 psig, or preferably, about 200 psig (14.3 bar). These conditions are maintained for about 10 minutes to about 1 hour, or preferably, about 10 to about 50 minutes, after which, the air is cooled while no more air is added to the autoclave. After about 20 minutes of cooling, the excess air pressure is vented and the photovoltaic module is removed from the autoclave. The described lamination process should not be considered limiting. Essentially, any photovoltaic module lamination process known within the art may be used to produce the back-contact photovoltaic modules with the integrated back-sheet and the assembly as disclosed herein.

In the disclosed embodiments, cost effective formation of an integrated back-sheet assembly for back-contact solar modules, and of back-contact solar modules made with such assemblies is provided. Openings in the insulating layer are quickly and easily formed and aligned with the electrical contacts on the back side of back-contact solar cells and with the electrically conductive metal circuits integrated in the back-sheet. The disclosed embodiments provide a back-contact photovoltaic module with integrated back-sheets that can be produced efficiently and consistently.

EXAMPLES

The following Examples are intended to be illustrative of the present invention, and are not intended in any way to limit the scope of the present invention.

Materials Used in Examples

PET film: Corona treated (both sides) Melinex™ S polyethylene terephthalate film (188 or 250 µm thicknesses) with a density equal to 1.40 g/cm$^3$, obtained from DuPont Teijin Films (U.S.A.);

Ethylene acrylate copolymer resin: Bynel® 22E757 modified ethylene acrylate copolymer resin with a density equal to 0.94 g/cm$^3$, an MFI equal to 8.0 g/10 min, and a melting point equal to 92° C., obtained from E. I. du Pont de Nemours and Company (U.S.A.) ("DuPont");

Ethylene methacrylic acid copolymer: Nucrel® 0910 ethylene and methacrylic acid copolymer with a density equal to 0.93 g/cm$^3$, an MFI equal to 10.0 g/10 min, and a melting point equal to 100° C., obtained from DuPont;

PVF film: Tedlar® polyvinyl fluoride oriented film with a thickness of 38 µm, obtained from DuPont.

Polyurethane adhesive: polyurethane adhesive (PP-5430), obtained from Mitsui Chemicals.

Copper (Cu) foil: 35 micron thick copper foil, obtained from Suzhou Fukuda Metal Co., Ltd. of Suzhou, China.

EVA sheet: Revax™ 767 ethylene vinyl acetate (EVA) sheet (450 µm thick), obtained from Wenzhou RuiYang Photovoltaic Material Co. Ltd. (China);

Ag-1 particles: silver flakes with a particle size of 2-4 µm, obtained from Kunming Noble Metal Electronic Materials Co., Ltd. (China);

Ag-2 particles: silver flakes and crystals with a particle size of 3-5 µm, obtained from Kunming Noble Metal Electronic Materials Co. Ltd.;

Ag-3 particles: silver powders with a particle size of 5.4-11 µm, obtained from DuPont;

EVA resin: Elvax® PV 1650 ethylene-vinyl acetate copolymer resin, obtained from DuPont;

TBEC: OO-tert-Butyl O-2-(ethylhexyl) monoperoxycarbonate, obtained from LanZhou Agent Plant, China;

Silane Coupling Agent (SCA): 3-glycidoxypropyltriethoxysilane, obtained from Shin-Etsu Chemical (Japan) under the trade name KBM403;

Antioxidant (AO): 2',3-bis [[3-[3, 5-di-tert-butyl-4-hydroxyphenyl]propionyl]] propionohydrazide, obtained from BASF (Germany) under the trade name Irganox™ MD1024;

VC-30: VC-30 with 4,4'-[2,2,2-Trifluoro-1-(trifluoromethyl)ethylidene]diphenol (30-50%), Polyvinylidenefluoride/hexafluoropropene (30-50%), and Limestone (<2%), obtained from DuPont;

VC-20: VC-20 with Benzyltriphenylphosphonium chloride (<35%), Polyvinylidenefluoride/hexafluoropropene (>60%), Limestone (<4%), and Barium sulfate (<1%), obtained from DuPont;

MgO: Kyowamag 150 MgO, obtained from Kyowa Chemical Industry Co., Ltd. (Japan);

Ca(OH)$_2$: NICC 5000 Ca(OH)$_2$, obtained from Jingjiang City ChangFeng Trade Co., Ltd. (China);

Viton®-A: Viton A® 200 Polyvinylidenefluoride/hexafluoropropene, obtained from DuPont;

MIBK: Methyl isobutyl ketone, obtained from Sinopharm Chemical Reagent Co, Ltd. (China).

Polyethylene release film: 3M™ polyethylene protective tape 5112C with a thickness of 127 µm, obtained from 3M Company (U.S.A.).

Peel Strength Test Method

Peel strength is a measure of adhesion between layers or materials. Peel strength is measured according to the ASTM D1876 Standard and is expressed in units of N/cm. For example, when the peel strength was tested between the EVA sheet insulating layer and a Cu foil of a Cu-integrated back-sheet, where the EVA sheet faces the Cu foil to which release pads have been applied, the EVA sheet/Cu-integrated back-sheet laminate was cut into sample strips of 2.54 cm in width and 10 cm in length, and the EVA sheet and the Cu-integrated back-sheet substrate were fixed respectively in the upper and lower grips of an extension meter to carry out a peeling test at a speed of 5 in/min (12.7 cm/min).

Preparation of Back-Sheet with Integrated Metal Circuit

Copper foil was laminated to a polymer substrate by an extruded tie layer, and then was cut by die cutting to make patterned circuits. The polymer substrate included a 188 micron-thick Melinex™ S PET film that was corona treated on both sides. A 38 micron-thick Tedlar® PVF film was adhered to one side of the PET film using a 10 micron thick layer of the PP-5430 polyurethane adhesive. On an extrusion-lamination machine manufactured by Davis Standard, a 1:1 (w/w) blend of Bynel® 22E757 ethylene acrylate copolymer and Nucrel® 0910 ethylene and methacrylic acid copolymer resin was extruded at an extrusion temperature of 285° C. between the 35 micron thick Cu foil and the side of the PET film opposite of the PVF film to form a tie layer with a thickness of about 100 µm between the Cu foil and the polymer substrate.

A flat die cutting press by Suzhou Tianhao electronic material Co., Ltd of Suzhou, China was used to cut through both the Cu foil and tie layer without cutting the underlying PET film. The Cu foil and adhesive tie layer was die cut in a zig zag pattern like that shown in FIG. 1a using a like shaped double die cutting blade. The waste foil segments from between the die cut blades were peeled off to form separated foil circuit patterns on the polymer substrate. The cut Cu foil had a pattern like in FIG. 1a. The as-made Cu-integrated back-sheet was used in the Examples below.

Preparation of Integrated Back-Sheet Assembly

In the following examples, the above-described back-sheet substrate with integrated electrically conductive metal foil circuits was used to create the disclosed assembly for electrical connection to back-contact solar cells.

Example E1

In Example E1, the integrated back-sheet assembly was prepared as follows.

An electrically conductive adhesive (ECA) was prepared. 92.6 wt % Viton® A, 5.6 wt % VC-30, 1.8 wt % VC-20 were compounded on a two roll mill (LRMR-S-150/0 Automatic small roll mill, Labtech Engineering Co., Ltd) at room temperature for 20 minutes. The resulting composite mixture was designated E1-Part A. 76.7 wt % Viton® A, 19.4 wt % MgO and 3.9 wt % Ca(OH)$_2$ were compounded in the same manner and the resulting compounded mixture was designated E1-Part B. The E1-Part A and E1-Part B mixtures were separately dissolved in MIBK at a ratio of 4:10 (E1-Part A or E1-Part B: MIBK). 3.73 grams of E1-Part B MIBK solution was put in mortar and ground for 2 minutes with 3.9 grams Ag-1 particles with a pestle. Another 3.9 grams Ag-2 particles was added and ground for another 3 minutes. Then, 3.73 grams of E1-Part A MIBK solution was added and ground for 5 minutes to make the ECA that was ready for screen printing use.

The prepared ECA was screen printed on the Cu foil surface of the Cu-integrated back-sheet as disc-shaped release pads of 3 mm diameter and a 30 μm thickness and dried at 120° C. for 10 minutes. The release pads were printed in a pattern like that shown in FIG. 3 so as to correspond to the pattern of the back contacts on MWT back-contact solar cells. The 450 μm thick EVA sheet was thermally applied over the Cu foil circuits and the release pads on an HL-101 Hotroll laminator from Cheminstruments at 70° C./35 MPa pressure in air with the Cu foil side facing the EVA sheet. The peel strength between the electrically conductive release pads and the copper foil was about 3.5 N/cm. The peel strength between the EVA sheet and the electrically conductive release pads was about 0.3 N/cm.

Holes were die-cut in the EVA sheet in a pattern corresponding to the pattern of the release pads with a die cut hole in the EVA sheet over each of the release pads. The die cut holes in the EVA sheet had a cross section substantially the same as that of the surface of the underlying release pads. The EVA sheet was removed from each of the die cut holes to expose the electrically conductive release pads adhered to the Cu foil. The holes were filled with electrical conductive adhesive discs (with a final Ag concentration of 78 wt %) made by (i) mixing 33 g of the EVA resin with 0.4 g TBEC, 0.3 g SCA, and 0.12 g AO using a spatula, and (ii) compounding 92 g Ag-2 particles and 25 g Ag-3 particles into the above mixture using a Internal Mixer (SU-70 Internal Mixer from Changzhou Suyan Science and Technology Co., Ltd. China) at 80° C. for 10 minutes to obtain electrically conductive adhesive. This electrically conductive adhesive was hot pressed into 420 μm-thick film at 100° C. and was then die cut into discs with a 2.5 mm diameter. The electrically conductive adhesive discs were inserted into the die cut holes of the EVA sheet to provide an assembly like that shown in the cross section in FIG. 7.

Example E2

In Example E2, the integrated back-sheet was prepared as follows.

The polyethylene release film (127 μm thick tape) was attached to the Cu foil surface of the above described of the Cu-integrated back-sheet. The release film was die cut in a pattern as described above in Example E1 to make release pads. The waste release film portions between the release pads was peeled off the Cu foil.

The 450 μm thick EVA sheet was thermally applied over the copper foil circuits and the release pads at 100° C. for 5 mins in air with the Cu foil side facing EVA sheet. Holes were die-cut in the EVA sheet in a pattern corresponding to the pattern of the release pads with a die cut hole in the EVA film over each of the release pads. The die cut holes in the EVA sheet had a cross section substantially the same as that of the surface of the underlying release pads. The die-cut EVA sections were removed with the release pads from each of the die cut holes to expose the Cu foil. The holes in the EVA sheet were filled with the same electrically conductive adhesive-discs as made in Example E1 except that the thickness of the discs was 450 μm.

What is claimed is:

1. A process for forming a back-sheet assembly for a photovoltaic module having multiple solar cells with back-side electrical contacts, comprising:

providing a substrate having a back surface and a front surface;

adhering an electrically conductive metal circuit to the front surface of said substrate;

adhering a plurality of discrete release pads to the electrically conductive metal circuit in a pattern, wherein said plurality of discrete release pads are comprised of an electrically conductive polymeric material and said plurality of discrete release pads do not touch each other;

adhering an insulating layer to said electrically conductive metal circuit over said electrically conductive metal circuit and said plurality of discrete release pads, wherein the peel strength between said plurality of discrete release pads and said electrically conductive metal circuit is greater than the peel strength between said plurality of discrete release pads and the insulating layer;

cutting said insulating layer to form a plurality of discrete cut sections in said insulating layer in a pattern corresponding to the pattern in which the plurality of discrete release pads are adhered to the electrically conductive metal circuit, each of said plurality of discrete cut sections in said insulating layer being disposed over a corresponding one of said plurality of discrete release pads;

removing said plurality of discrete cut sections in said insulating layer from said insulating layer, wherein the removing the plurality of discrete cut sections of the insulating layer over said plurality of discrete release pads leaves a plurality of openings in said insulating layer in a pattern corresponding to the pattern in which the plurality of discrete release pads are adhered to the electrically conductive metal circuit; and filling said plurality of openings in said insulating layer with an electrically conductive material such that the electrically conductive material in each opening of said plurality of openings in the insulating layer is in electrical contact with the electrically conductive metal circuit through the electrically conductive polymeric material of each corresponding discrete release pad of said plurality of discrete release pad.

2. The process of claim 1 wherein said plurality of discrete release pads are screen printed on said electrically conductive metal circuit.

3. The process of claim 1 wherein said plurality of discrete release pads are formed by casting, extruding or laminating a polymer layer on said electrically conductive metal circuit, cutting the polymer layer to form said plurality of discrete release pads in said polymer layer and polymer layer portions between and around said plurality of discrete release pads, and removing said polymer layer portions between and around said plurality of discrete release pads.

4. The process of claim 1 wherein said insulating layer comprises a polymer insulating layer.

5. The process of claim 4 wherein said polymer insulating layer is extruded, laminated or cast on said electrically conductive metal circuit.

6. The process of claim 4 wherein said insulating layer comprises at least two layers.

7. The process of claim 6 wherein said at least two layers comprise an interlayer dielectric adhered to said electrically conductive metal circuit and an encapsulant layer adhered to said interlayer dielectric.

8. The process of claim 1 wherein the cutting of said insulating layer to form the plurality of discrete cut sections is done by die cutting, laser cutting, or calendering.

9. The process of claim 1 wherein in the step of filling said plurality of openings in said insulating layer with said electrically conductive material, the electrically conductive material comprises a plurality of electrically conductive solid objects that are inserted into corresponding openings in said insulating layer.

10. The process of claim 1 wherein in the step of filling said plurality of openings in said insulating layer with said electrically conductive material, the electrically conductive material is an electrically conductive adhesive in the form of a liquid, a melt or a powder.

11. The process of claim 10 wherein said electrically conductive adhesive is a polymer filled with conductive metal particles.

12. The process of claim 1 wherein said electrically conductive metal circuit comprises a plurality of electrically conductive circuits formed from an electrically conductive metal foil.

13. A process for forming a back-contact photovoltaic module, comprising:

providing said back-sheet assembly of claim 1;

providing a plurality of back-contact solar cells having a light receiving side and an opposite back side, said plurality of back-contact solar cells each having a plurality of electrical contacts on the opposite back side in a pattern corresponding to the pattern of the plurality of openings in the insulating layer that are filled with the electrically conductive material; and adhering the opposite back side of the plurality of back-contact solar cells to the insulating layer such that the plurality of electrical contacts on the back side of the plurality of back-contact solar cells are in electrical contact with the electrically conductive metal circuit through the electrically conductive material in the plurality of openings in said insulating layer.

* * * * *